United States Patent
Amstatt et al.

(10) Patent No.: US 9,559,256 B2
(45) Date of Patent: Jan. 31, 2017

(54) METHOD FOR MANUFACTURING A SEMICONDUCTOR STRUCTURE AND SEMICONDUCTOR COMPONENT COMPRISING SUCH A SEMICONDUCTOR STRUCTURE

(71) Applicant: COMMISSARIAT A L'ENERGIE ATOMIQUE ET AUX ENERGIES ALTERNATIVES, Paris (FR)

(72) Inventors: Benoit Amstatt, Grenoble (FR); Bruno-Jules Daudin, La Tronche (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/898,684

(22) PCT Filed: Jun. 19, 2014

(86) PCT No.: PCT/EP2014/062945
§ 371 (c)(1),
(2) Date: Dec. 15, 2015

(87) PCT Pub. No.: WO2014/202722
PCT Pub. Date: Dec. 24, 2014

(65) Prior Publication Data
US 2016/0141451 A1 May 19, 2016

(30) Foreign Application Priority Data
Jun. 21, 2013 (FR) ...................................... 13 55923

(51) Int. Cl.
*H01L 21/00* (2006.01)
*H01L 33/00* (2010.01)
(Continued)

(52) U.S. Cl.
CPC ........... *H01L 33/12* (2013.01); *H01L 21/0254* (2013.01); *H01L 21/02381* (2013.01);
(Continued)

(58) Field of Classification Search
CPC ........ H01L 33/12; H01L 33/007; H01L 33/32; H01L 33/08; H01L 33/06; H01L 33/16; H01L 33/24; H01L 21/02603; H01L 21/02639; H01L 21/02381; H01L 21/02447; H01L 21/02513; H01L 21/0254
See application file for complete search history.

(56) References Cited

U.S. PATENT DOCUMENTS

| 6,524,932 B1 | 2/2003 | Zhang et al. |
| 2013/0221322 A1 | 8/2013 | Ohlsson |

FOREIGN PATENT DOCUMENTS

| FR | 2 922 685 A1 | 4/2009 |
| WO | 2011/162715 A1 | 12/2011 |

OTHER PUBLICATIONS

Boo et al., "Growth of hexagonal GaN thin films on Si (111) withy cubic SiC buffer layer", 1998, Journal of Crystal Growth, vol. 189/190, pp. 183-188, Dec. 1998.*

(Continued)

*Primary Examiner* — Nikolay Yushin
(74) *Attorney, Agent, or Firm* — Oblon, McClelland, Maier & Neustadt, L.L.P.

(57) ABSTRACT

A method for manufacturing at least one semiconductor structure, and a component including a structure formed with the method, the method including: providing a substrate including at least one semiconductor silicon surface; forming an amorphous silicon carbide layer in contact with at least one part of the semiconductor silicon surface; forming the at least one semiconductor structure in contact (Continued)

with the silicon carbide layer, the structure including at least one part, as a contact part, in contact with the surface of the silicon carbide layer, which includes gallium.

12 Claims, 3 Drawing Sheets

(51) Int. Cl.
  *H01L 33/12* (2010.01)
  *H01L 21/02* (2006.01)
  *H01L 33/06* (2010.01)
  *H01L 33/08* (2010.01)
  *H01L 33/32* (2010.01)
  *H01L 33/16* (2010.01)
  *H01L 33/24* (2010.01)

(52) U.S. Cl.
  CPC .. *H01L 21/02447* (2013.01); *H01L 21/02513* (2013.01); *H01L 21/02603* (2013.01); *H01L 21/02639* (2013.01); *H01L 33/007* (2013.01); *H01L 33/06* (2013.01); *H01L 33/08* (2013.01); *H01L 33/32* (2013.01); *H01L 33/16* (2013.01); *H01L 33/24* (2013.01)

(56) References Cited

OTHER PUBLICATIONS

Iliescu et al., "PECVD Amorphous Silicon Carbide (α-SiC) Layers . . . ", 2013, INTECH, Chapter 5, pp. 131-148, published Feb. 10, 2013.*
Lei et al., "Epitaxial growth of zinc blend and wurtzite gallium nitride thin film on (001) silicon", 1991, Applied Physics Letters, vol. 59(8). pp. 944-946 (published Jun. 13, 1991).*
Cervantes-Contreras, M. et al., "Molecular beam epitaxial growth of GaN on (100)- and (111) Si substrates coated with a thin SiC layer" Journal of Crystal Growth, vol. 227-228, Jul. 1, 2001, pp. 425-430, XP004250871.
Wang, D, et al., "Si-doped cubic GaN grown on a Si(001) substrate with a thin flat SiC buffer layer" Applied Physics Letters, vol. 80, No. 14, Apr. 8, 2002, pp. 2472-2474, XP012030494.
Losurdo, Maria, et al., "Structural and optical investigation of plasma deposited silicon carbon alloys: Insights on Si—C bond configuration using spectroscopic ellipsometry" Journal of Applied Physics, vol. 97, No. 103504, 2005, 7 pages.
Magafas, Lykourgos, et al., "Electrical properties of annealed aSiC:H thin films" Journal of Non-Crystalline Solids, vol. 353, pp. 1065-1069, May 2007.
International Search Report issued on Aug. 8, 2014 for PCT/EP2014/062945 filed on Jun. 19, 2014.
French Search Report issued on Feb. 27, 2014 for FR13 55923 filed on Jun. 21, 2014.

* cited by examiner (g)

METHOD FOR MANUFACTURING A SEMICONDUCTOR STRUCTURE AND SEMICONDUCTOR COMPONENT COMPRISING SUCH A SEMICONDUCTOR STRUCTURE

TECHNICAL FIELD

The invention relates to the field of semiconductor structures and methods for manufacturing such structures.

For the purpose of improving the performances of semiconductor components, the research about this has focused on structures in the microscale or even nanoscale ranges.

Indeed, the use of such structures provides several advantages. Therefrom, one can in particular mention the fact that such structures offer the possibility of developing components which are no longer planar but with three dimensions. Thus, the functional area of the component is significantly increased without significantly increasing its dimensions. This is in particular the case of semiconductor wires.

From the research orientations on these structures, and in particular on the semiconductor wires, optimizing these methods allowing their manufacture in a controlled manner remains a priority.

Thus, the invention specially relates to a method for manufacturing a semiconductor structure and a semiconductor component comprising such a structure.

STATE OF PRIOR ART

Controlled methods for manufacturing semiconductor structures such as wires of gallium nitride (GaN) should take into account requirements related to the materials making them up, as well as those related to the type of semiconductor structures and materials forming the support.

Thus, a method for manufacturing structures comprising gallium (Ga), such as semiconductor wires of gallium nitride (GaN), on a surface comprising silicon (Si) remains particularly problematic given that a phenomenon of etching silicon (Si) by gallium (Ga) competes with the phenomenon of crystallization of the material to be deposited.

As a result, for the formation of structures comprising gallium (Ga) on a silicon (Si) surface, it is necessary either to protect beforehand the support surface with an aluminum nitride (AlN) protecting layer which has the drawback of being poorly low conducting since it has an energy band gap of 6.3 eV, or to search for growth conditions specifically suitable for the structures to be formed. Both these solutions remain poorly ideal, since the first one does not enable the formation of a good electric contact between the support and the structures formed and the second one requiring a long adaptation procedure for each type of structure to be formed.

DISCLOSURE OF THE INVENTION

The present invention aims at overcoming these drawbacks.

Thus, one purpose of the invention is to provide a method for manufacturing a semiconductor structure at the surface of a support, the structure comprising gallium and the surface of the support comprising silicon, not having the problems inherent to the use of an aluminum nitride (AlN) nucleation layer and not requiring long adaptation procedures.

To that end, the invention relates to a method for manufacturing at least one semiconductor structure comprising the following steps of:

providing a substrate comprising at least one semiconductor silicon surface, forming an amorphous silicon carbide layer in contact with at least one part of the semiconductor silicon surface, forming the at least one semiconductor structure in contact with the silicon carbide layer, said structure comprising at least one part, called a contact part, in contact with the surface of the silicon carbide layer, which comprises gallium.

A silicon carbide layer is described as amorphous when it has a diffraction pattern in transmission electron microscopy, in correspondence with the layer in itself, comprising one or more diffuse rings or diffuse spots.

In the case where it includes some crystalline zones, the corresponding diffraction pattern in transmission electron microscopy has diffraction spots associated with the crystals as well as one or more diffuse rings or diffuse spots associated with the amorphous part of the layer.

By "in correspondence with the layer in itself", it is intended here that the diffraction peaks corresponding to other materials than that of the layer in question, such as that of the substrate, are not to be taken into account to describe the silicon carbide layer.

Such a method enables the formation of a semiconductor structure having an improved electrical contact towards a semiconductor structure formed by a method of prior art involving an aluminum nitride (AlN) buffer layer, without requiring long adaptation procedures. Indeed, silicon carbide (SiC), when in the amorphous form, has, as shown by the works of Losurdo et al. published in 2005 in the scientific journal "Journal of Applied Physics" N° 97, pages 103504, an energy band gap of 2.5 eV, that is an energy band gap more than twice lower than that of aluminum nitride.

Furthermore, silicon carbide is a chemically stable material, and thus poorly likely to react with gallium (Ga), up to temperatures higher than 1,000° C. Thus, a silicon carbide layer enables the silicon surface to be protected from any etching reaction of gallium on the same during the step of forming the at least one semiconductor structure comprising gallium.

In addition, silicon carbide in its amorphous form allows, because of the absence of an epitaxy relation towards the surface of the substrate on which it is in contact, to relax possible stresses which may exist between the silicon surface and the structure which is formed at the surface of the silicon carbide layer. Thus a structure formed by means of such a method has little or even no dislocations in spite of the possible presence of a strong lattice mismatch between the silicon surface and the material forming the contact part of the structure. Thus, such a method, because of the role of the amorphous silicon carbide layer in stress relaxation and for the protection it offers to the silicon surface, therefore does not require a long adaptation procedure for each structure type to be formed. Such a method is thus well suitable for the growth of structures regardless of their type unlike methods of prior art for which the growth of the structures directly occurs on a silicon surface.

The at least one structure can be a semiconductor wire.

By semiconductor wire, it is meant above and in the rest of this document, a semiconductor structure having 3 dimensions, one of these dimensions, called the longitudinal dimension, is at least 5 times and preferentially, at least 10 times higher than the larger of the two other dimensions, which are called lateral dimensions. Thus, by semiconductor wire it is intended the semiconductor nanowires, that is wires the lateral dimensions of which are lower than or equal to 100 nm, and the semiconductor microwires, that is wires the lateral dimensions of which are between 100 nm and 100 µm.

Such a method is particularly suitable for the growth of semiconductor wires by permitting the possibility of forming a film having a good electrical contact with the silicon surface.

The thickness of the silicon carbide layer can be lower than 10 nm and preferentially than 5 nm.

A thickness of the silicon carbide layer lower than 10 nm and preferentially lower than 5 nm allows to transmit through the silicon carbide layer, despite its amorphous character, the crystalline orientation of the silicon surface to the at least one semiconductor structure.

In addition, for a thickness lower than 5 nm, a part of the electrical contact between the structure and the silicon surface is provided by tunnel effect. Thus, it is not necessary to optimize the growth conditions of the silicon carbide layer to make sure that the silicon carbide layer allows a good contact between the structure and the silicon surface.

The step for forming the silicon carbide layer can comprise a chemical deposition step on the semiconductor silicon surface such as a plasma enhanced chemical vapor deposition.

Such growth methods enable amorphous silicon carbide layers to be provided with well controlled thickness and composition.

The contact part can be of gallium nitride.

A structure comprising a contact part of gallium nitride (GaN) benefits particularly from the use of an amorphous silicon carbide layer.

The structure can be a structure of gallium nitride.

A structure of gallium nitride (GaN) benefits particularly from the use of an amorphous silicon carbide layer.

The step of forming the silicon carbide layer can comprise the following sub-steps of:
  depositing a thick amorphous silicon carbide layer on at least one part of the semiconductor silicon surface,
  removing a part of a thickness of the thick amorphous silicon carbide layer so as to form the amorphous silicon layer.

Such a deposition procedure enables a good control of the thickness of the silicon carbide layer to be achieved throughout the thickness of the silicon surface regardless of the size of this surface.

The sub-step of removing a part of the thickness of the amorphous silicon carbide layer can be achieved by a mechanical method such as for example a procedure of polishing the thick silicon carbide layer.

The step of forming the at least one structure can comprise the following sub-steps of:
  forming a mask in contact with the surface of the silicon carbide layer, said mask leaving free at least one surface portion of the silicon carbide layer which is called formation portion,
  growing at least one structure in contact with the at least one formation portion.

The mask can comprise silicon nitride or silica.

Such a method enables the at least one structure which is located by defining the at least one formation portion to be grown. Thus, such a method is particularly interesting in the case where the structure has to be linked with other structures provided in the substrate. In addition, with such a method, the mask, when the material making it up is adapted, can also passivate the part of the surface of the substrate on which the at least one structure has not grown.

The step of forming the at least one structure can comprise the sub-step of depositing a first material comprising gallium under deposition conditions suitable for forming self-organized structures at the surface of the silicon carbide layer.

Such a growth method enables to form, on the entire surface of the silicon carbide layer, the semiconductor structures thus enabling a functionalization of the same to be obtained in a single step.

The step of forming the at least one structure can comprise the following sub-steps of:
  forming a mask in contact with the silicon carbide layer, said mask covering at least one surface portion of the silicon carbide layer which is called a formation portion, and leaving free the rest of the silicon carbide layer
  selectively removing the part of the silicon carbide layer which is free of mask, the at least one surface portion of the silicon carbide layer remaining protected by the mask,
  removing the mask so as to release the at least one portion,
  growing at least one structure in contact with the at least one formation portion.

Such a method enables the at least one structure which is located by defining the at least one formation portion to be grown without the same being covered with a mask. Thus, it is possible, after the at least one structure is formed at a perfectly controlled location, to form other structures in connection with the at least one structure without the formation of the same being hindered by the presence of any mask or of the silicon carbide layer.

The contact part of the structure can be formed of a first material comprising gallium, the step of forming the at least one structure can comprises a sub-step of forming a layer of a first material in contact with at least one portion of the silicon carbide layer, a portion of said layer forming a part of the at least one structure.

A method implementing a layer of the first material offers the possibility to form a structure with its contact part which has a good electrical contact since it is achieved by means of the layer of the first material.

The contact part of the structure can be formed of a first material comprising gallium, the step of forming the at least one structure can comprise the following sub-steps of:
  forming a layer of the first material in contact with at least one part of the silicon carbide layer, at least one portion of said part, called formation portion, being intended to form a part of the at least one semiconductor structure,
  forming a mask in contact with the layer of the first material, said mask leaving free the at least one surface portion of material layer which is called the formation portion,
  growing the rest of the at least one structure in contact with the at least one formation portion.

Such a method enables the rest of the at least one structure which is located by defining the at least one formation portion to be grown. Thus, such a method is particularly interesting in the case where the structure is to be linked with other structures provided in the substrate. In addition, with such a method, the mask, when the material making it up is adapted, can also passivate the surface of the substrate on which the at least one structure has not grown. In addition, the use of a layer of the first material offers the possibility of forming a structure with its part in contact with the layer of the first material with a good crystallographic quality since it is possible to form it by homoepitaxy.

The contact part of the structure can be formed of a first material comprising gallium, the step of forming the at least one structure can comprise the following sub-steps of:
    forming a layer of the first material in contact with at least one part of the silicon carbide layer, and
    depositing a first material comprising gallium under deposition conditions suitable for forming self-organized structures at the surface of the layer of the first material.

Such a growth method allows to form on the entire surface of the silicon carbide layer the semiconductor structures thus enabling the functionalization of the latter surface to be achieved in a single step. In addition, the use of a layer of the first material offers the possibility of forming the structure with its part in contact with the layer of the first material with a good crystallographic quality on its entire thickness, this comprising a homoepitaxy growth step.

The contact part of the structure can be formed of a first material comprising gallium, the step of forming the at least one structure can comprise the following sub-steps of:
    forming a layer of the first material in contact with at least one part of the silicon carbide layer,
    forming a mask in contact with the layer of the first material, said mask covering at least one surface portion of the layer of the first material which is called a formation portion, and leaving free the rest of the silicon carbide layer,
    selectively removing the rest of the layer of the first material and of the silicon carbide layer which is free of mask, the at least one surface portion of the layer of the first material, as well as the portion of the silicon carbide layer protected by the latter portion, remaining protected by the mask,
    removing the mask so as to release the at least one formation portion,
    growing at least one structure in contact with the at least one formation portion.

The invention also relates to a semiconductor component comprising:
    a substrate comprising at least one surface of semiconductor silicon,
    an amorphous silicon carbide layer in contact with at least one part of the semiconductor silicon surface,
    at least one semiconductor structure in contact with the silicon carbide layer, the part of the structure in contact with the silicon carbide layer comprising gallium.

Such a component can be obtained by a manufacturing method not requiring a long adaptation procedure upon placing it, with an electrical contact between the at least one wire and the silicon surface being improved with respect to that of a component of prior art comprising an aluminum nitride (AlN) layer.

The at least one structure can be a semiconductor wire.

The silicon carbide layer has a thickness lower than 10 nm and preferentially than 5 nm.

A layer of a first material comprising gallium can be further provided, the structure comprising a part of the layer by which it is in contact with the silicon carbide layer.

The structure can comprises a body of gallium nitride by which it is in contact with the silicon carbide layer.

BRIEF DESCRIPTION OF THE DRAWINGS

The present invention will be better understood upon reading the description of exemplary embodiments, given by way of purely indicating and in no way limiting purposes, making reference to the appended drawings in which.

Identical, similar or equivalent parts of the different figures bear the same reference numerals so as to facilitate switching from one figure to another.

The different parts represented in the figures are not necessarily drawn to a uniform scale, to make the figures more understandable.

The different possibilities (alternatives and embodiments) have to be understood as being not exclusive from each other and can been combined with each other.

DETAILED DISCLOSURE OF PARTICULAR EMBODIMENTS

The present invention relates to the manufacture of semiconductor structures, for example microwires, nanowires or pyramid-shaped elements. Below in this document, the embodiments described relate to the manufacture of microwires or nanowires. However, these embodiments can be implemented for manufacturing semiconductor structures other than microwires or nanowires, for example for manufacturing pyramid-shaped three-dimensional structures.

Throughout this document, by semiconductor wires, nanowires or microwires, it is intended semiconductor structures having three dimensions and with an elongate shape, two of which are in the same order of magnitude between 5 nm and 2.5 µm, the third dimension being at least equal to 2 times, 5 times or preferentially 10 times the greater of both other dimensions.

Figure 1:
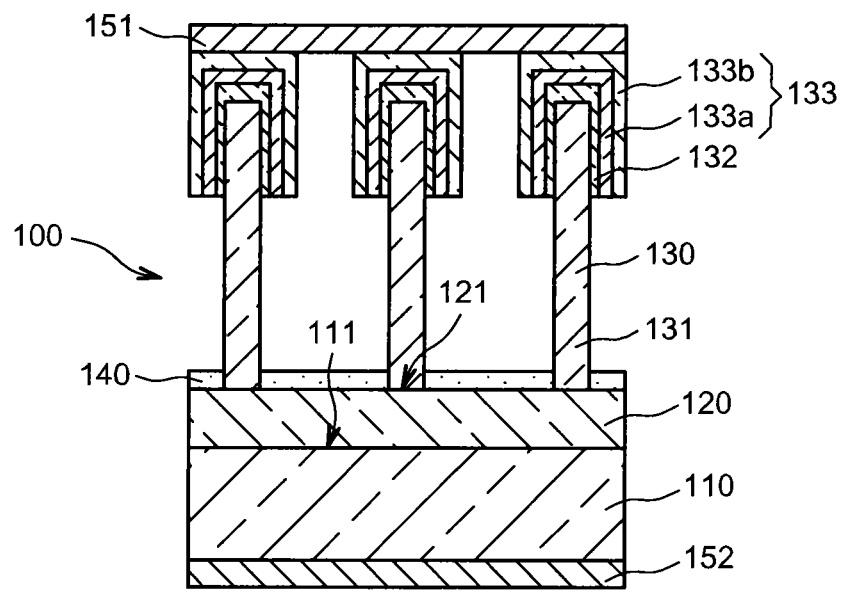
FIG. 1 illustrates an example of a semiconductor component according to a first embodiment of the invention.

FIG. 1 illustrates a semiconductor component 100, comprising semiconductor structures according to the invention which are semiconductor wires, which is for emitting light.

The component 100 illustrated in FIG. 1 is a component according to a particular application of the invention which is suitable for emitting light the wavelength of which is comprised in the visible wavelength range. The values and materials, when mentioned in relation with the particular application, are only given by way of example purposes and therefore are not restrictive of the invention.

The component 100 illustrated in FIG. 1 comprises:
    a substrate 110 having a semiconductor silicon surface 111,
    an amorphous silicon carbide layer 120 in contact with the surface,
    semiconductor wires 130 having at least one part 131, called contact part, in contact with the silicon carbide layer 120.

The substrate 110 is a preferentially semiconductor planar support and comprising a semiconductor silicon surface 111. Thus, according to a conventional possibility of the invention, the substrate 110 can be a semiconductor silicon substrate.

The substrate 110, in the case where upon operating the component, the wires 130 are biased through the substrate 110, has a concentration of majority carriers of at least $10^{18}$ $cm^{-3}$. The type of conductivity of the substrate is a first type of conductivity.

Thus, in the particular application, the substrate 110 is a silicon planar substrate the type of conductivity of which is that for which the majority carriers are electrons. In the same particular application, since biasing the wires 130 is made through the substrate 110, the concentration of majority carriers is at least $10^{18}$ cm$^{-3}$.

The silicon carbide layer 120 is in contact with the silicon surface 111 and is an amorphous silicon carbide layer.

By an amorphous silicon carbide layer, it is meant that the silicon carbide layer 120 has, in correspondence with the layer itself, a diffraction pattern in transmission electron microscopy comprising one or more diffuse ring or diffuse spots.

By "in correspondence with the layer in itself", it is meant, above and in the rest of this document, that the diffraction peaks corresponding to materials other than that of the layer in question, such as that of the substrate, are not to be taken into account to describe the silicon carbide layer.

The silicon carbide layer 120 has a thickness which is between 1 and 100 nm and is preferentially between 1 and 10 nm and further advantageously between 1 and 5 nm. According to another possibility for which a significant part of the conductivity between the wires 130 and the substrate 110 is obtained by tunnel effect, the thickness of the silicon carbide layer 120 is lower than 3 nm.

The silicon carbide layer 120 can comprise a concentration of dopant elements which are suitable for providing majority carriers corresponding to the first type of conductivity to the silicon carbide layer 120. Such dopant elements, in the case where, upon operating the component, the wires 130 are polarized through the substrate 110, are suitable for allowing an ohmic contact between the substrate 110 and the contact part 131 of the wires 130, that is they provide majority carriers of the first type of conductivity.

According to a possibility alternative or complementarity to the presence of dopant elements in the silicon carbide layer 120, the majority carriers of the silicon carbide layer 120 can be provided by the lattice defects of the silicon carbide layer 120.

Thus in the particular application, the silicon carbide layer 120 is preferentially suitable for having a type of conductivity for which the majority carriers are electrons. The concentration of majority carriers of the silicon carbide layer 120 is preferentially higher than $10^{18}$ cm$^{-3}$.

The component 100 also comprises, in contact with the silicon carbide layer 120, a mask 140.

The mask 140 can be a mask conventionally used in the microelectronic industry such as for example a mask of silica SiO$_2$, of silicon nitride of the Si$_3$N$_4$-type or of the Si$_x$Ni$_y$-type, or even titanium Ti. The mask 140 is configured to cover the zones of the silicon carbide layer 120 which are not in contact with the wires 130.

The mask 140 forms a layer for protecting the zones of the silicon carbide layer 120 which are not in contact with the wires 130. Advantageously, when the mask 140 is formed in a suitable material, such as silicon nitride Si$_3$N$_4$, it also enables the zones of the silicon carbide layer which are not in contact with the wires 130 to be passivated.

In the particular application, the mask is preferentially in a random Si$_x$Ni$_y$-type silicon nitride as described especially in document WO2012/136665.

The portions 121 of the silicon carbide surface 120 which are not covered by the mask 140 are called formation portions.

The wires 130 are each in contact with the silicon carbide surface 120 on one of the formation portions 121 of the silicon carbide surface 120. Each wire 130, according to the configuration illustrated in FIG. 1, comprises:

- a wire body 131 by which they are in contact with the silicon carbide layer 120, the wire body 131 being of the first type of conductivity,
- an active zone 132, preferentially of the non-intentionally doped type and comprising a carrier confinement system, said active zone 132 being in contact with the wire body 131 at the end of the wire body which is opposite to the silicon carbide layer 120,
- a zone 133 of the second type of conductivity in contact with the active zone 132, so as to form with the wire body 131 of the first type of conductivity a semiconductor junction extending in the active zone 132.

By non-intentionally doped zone it is meant, above and in the rest of the document, that the concentration of majority carriers in said zone is that of the material in which dopant elements have not been intentionally introduced, that is suitable for providing carriers, and which then has a concentration of majority carriers which is so-called unintentionally doped. The value and type of carriers in a zone of the unintentionally doped type are related to the method for forming said zone.

The wire body 131 of each of the wires 130 longitudinally extends from the formation portion 121 of the silicon carbide layer 120 along a direction substantially perpendicular to the surface 111 of the substrate 110. The side dimensions of each of the wire bodies 131 correspond to that of the formation portion corresponding to said wire body 131.

Thus, according to a conventional configuration, each wire body 131 has a constant side cross-section which can be, for example, a circular one. The diameter of the side cross-section of each of the wire bodies is between 5 nm and 2.5 μm. The length of each wire body 131 is between 50 nm and 50 μm.

Each wire body 131 is formed of a first semiconductor material comprising gallium Ga, such as for example gallium nitride GaN, gallium arsenide GaAs or indium-gallium arsenide In$_x$Ga$_{1-x}$As, with x being between 0 and 1. The wire bodies 131 have the first type of conductivity with preferentially a concentration of majority carriers which is higher than $10^{18}$ cm$^{-3}$.

The wire body 131 of each wire 130 forms a contact part of said wire 30.

In the particular application, each wire body 131 is of gallium nitride GaN. The wire bodies 131 have a type of conductivity for which the majority carriers are electrons. According to the same particular application, the concentration of majority carriers in each body is higher than or equal to $10^{18}$ cm$^{-3}$.

Each active zone 132 is in contact with the end of the corresponding wire body 131 which is opposite to the silicon carbide layer 120. Each active zone is in contact on a part of the length of the corresponding wire body 131 which represents a length proportion comprised between one tenth and a half of the total length of the wire body 131.

Each active zone 132 is formed by a semiconductor layer which is preferentially of the unintentionally doped type. At least one part of each of the active zones 132, and preferentially all of them, have a direct gap so as to allow radiative electron-hole pair recombinations in the active layer 132. According to a particularly advantageous possibility of the invention, when the wires 130 are light emitting wires, each of the active zones 132 comprises at least one confinement means for at least one type of carriers such as a plurality of potential wells.

By direct gap, it is meant above and in the rest of this document, that the material having such a direct gap comprises an energy maximum in its valence band and an energy minimum in its conduction band which are located at a value of the wave vector k substantially equal in the energy scatter diagram of said material.

In the particular application, each active zone 132 is formed by a gallium nitride layer in which quantum wells of $In_xGa_{1-x}As$-type indium-gallium arsenide are provided, the dimensions and proportion x of indium being adapted according to the emission wavelength of the corresponding wire 130.

Each zone 133 of the second type of conductivity is in contact with the corresponding active zone 132 such that said active zone 132 forms an interface between the corresponding wire bodies 131 and zone 133.

The zones 133 of the second type of conductivity are formed by at least one semiconductor layer of the second type of conductivity and are suitable for being electrically contacted by means of a polarization means.

According to the possibility illustrated in FIG. 1, each of the zones 133 of the second type of conductivity comprises two semiconductor layers 133a, 133b, a first layer 133a suitable for forming with the wire body 131 a semiconductor junction in the active layer 132 and a second layer 133b suitable for promoting an ohmic contact with a polarization means. According to the same possibility, said first and second layers 133a, 133b are both of the first type of conductivity.

In the particular application, according to the same possibility, the zones 133 of the second type of conductivity are each formed by a first layer 133a of gallium nitride GaN in contact with the corresponding active zone 132 which in turn is in contact with a second layer 133b of aluminum-gallium nitride. The first and second layers 133a, 133b are both of a type of conductivity for which the majority carriers are holes.

Each zone 133 is in contact with a polarization means suitable for electrically contacting said zone. Said means, for wires 130 suitable for light emission, are suitable for electrically contacting the zones of the second type of conductivity while letting at least part of the light emitted in the active zones 132 to pass. Such polarization means can for example take the form of a semi-transparent layer, such as an indium-tin oxide (ITO) or nickel-gold (Ni/Au) layer completed by a comb contact according to a configuration similar to that described in patent FR 2 922 685. Of course, all the polarization means suitable for electrically contacting the zones 133 while letting at least one part of the light emitted in the active zones 132 pass are compatible with this implementation of the invention.

Figure 2:
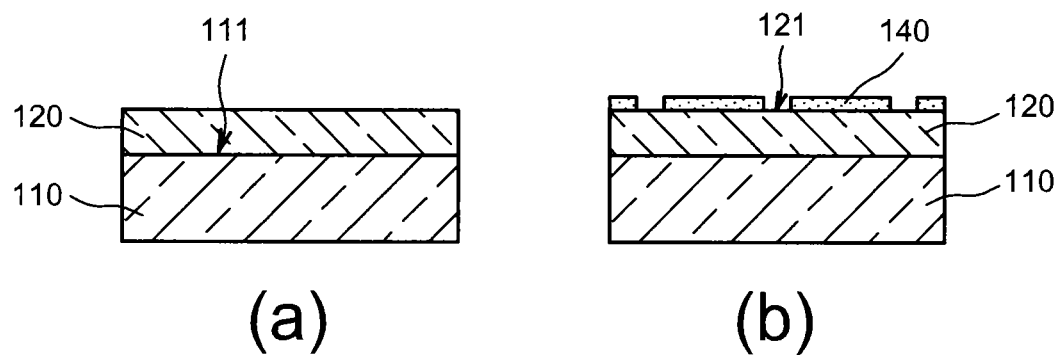
FIGS. 2a to 2g illustrate the main steps of a method for manufacturing a component as illustrated in FIG. 1.
Figure 2:
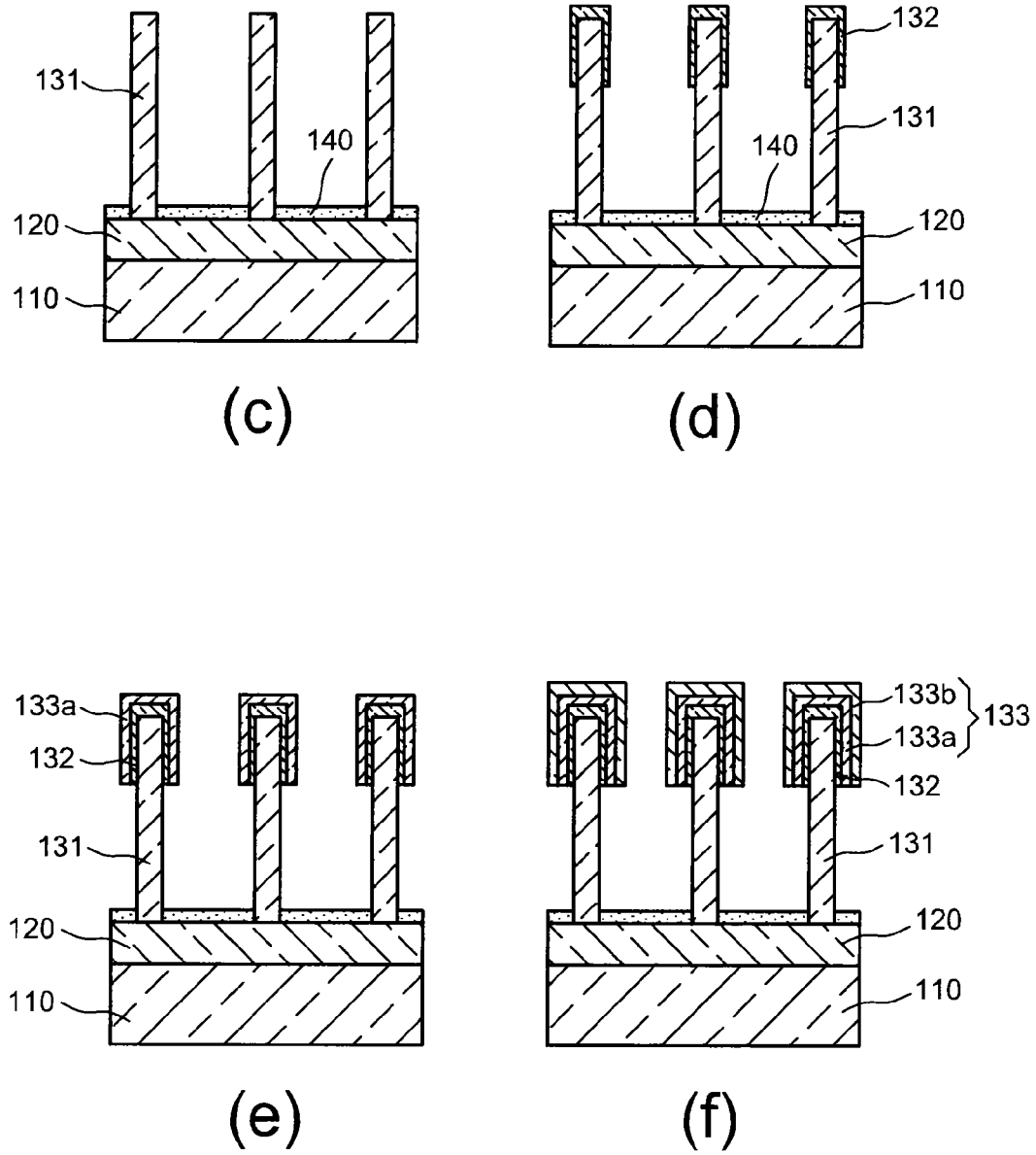
Figure 2:
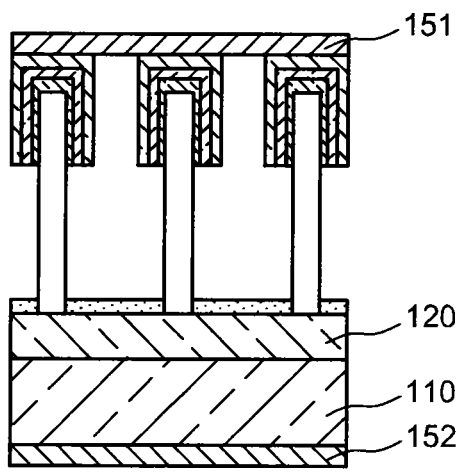

FIGS. 2a to 2g illustrate a method for manufacturing a component as illustrated in FIG. 1. Such a method comprises the following steps of:

providing a semiconductor substrate 110, forming an amorphous silicon carbide layer 120 in contact with the surface of the semiconductor support, as illustrated in FIG. 2a, forming a hard mask 140 of silicon nitride or of silicon dioxide in contact with the surface of the silicon carbide layer 120 which is opposite to the substrate 110, the hard mask 140 being suitable for leaving free only the formation portions 121 of the silicon carbide layer 120, as illustrated in FIG. 2b, growing the wire bodies 131 each in contact with a formation portion 121 of the silicon carbide layer 120, the growth off the formation portions 121 being inhibited by the hard mask 140, the wire bodies 130 being made of a first semiconductor material comprising gallium Ga, as illustrated in FIG. 2c, forming a semiconductor layer 132 at the end of the wire bodies 130 which is opposite to the silicon carbide layer 120 in order to form the active zone 132, said layer 132 comprising quantum wells, as illustrated in FIG. 2d, forming the first layers 133a of the second type of conductivity each in contact with a corresponding active zone 132, each of the first layers being suitable for forming with the corresponding wire body 131 a semiconductor junction extending in said active zone 132, as illustrated in FIG. 2e, forming the second layers 133b of the second type of conductivity each in contact with a corresponding first layer 133a, each of the second layers 133b being suitable for forming an ohmic contact with a polarization means, as illustrated in FIG. 2f, forming a polarization means in contact with each of the second layers 133b, said polarization means being suitable for electrically contacting the zones 133 of the second type of conductivity while letting at least one part of the light emitted in the active zones 132 pass, as illustrated in FIG. 2g.

During the step of forming the silicon carbide layer 120, the latter can be formed for example by physical deposition of silicon carbide obtained, such as by a radiofrequency-type sputtering. Such a deposition method is in particular described in the publication of Magafas et al published in 2007 in the scientific journal "Journal of Non-Crystalline Solids", volume 353, pages 1065 to 1969.

According to a non-illustrated possibility of the invention, the step of forming the silicon carbide layer 120 can comprise the following sub-steps of:

depositing a thick amorphous silicon carbide layer on at least one part of the surface of the substrate, removing a part of the thickness of the thick amorphous silicon carbide layer so as to form the amorphous silicon carbide layer 120.

According to the same possibility, the sub-step of removing a part of the thickness of the thick amorphous silicon carbide layer can be achieved by a mechanical method such as for example a procedure of polishing the thick silicon carbide layer. The same sub-step can also be achieved by a chemical method such as for example by reactive ion etching.

During the step of growing the wire bodies 131, depending on the method used for this growth, the substrate 110 and silicon carbide layer 120 can be subjected to temperatures sufficiently high to partially crystallize the silicon carbide layer 120. Thus, despite a silicon carbide layer 120 which is formed amorphous, the latter can, in the final component, further comprisescrystalline zones.

In the case of polycrystals, the crystalline zones have at least two zones comprising either crystalline orientations different from each other, either different silicon carbide polytypes, each zone forming a different crystal grain.

In such a case where the amorphous silicon carbide layer comprises some crystalline zones, the corresponding diffraction pattern in transmission electron microscopy has diffraction spots associated with the crystals as well as one or more diffuse rings or diffuse spots associated with the amorphous parts.

Figure 3:
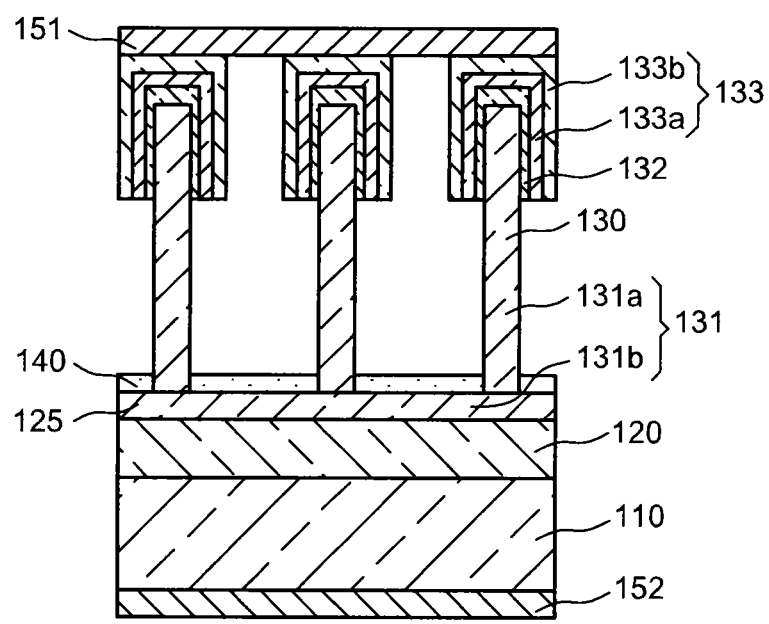
FIG. 3 illustrates a semiconductor component according to a second embodiment wherein a layer of a first material in contact with the silicon carbide layer is provided.

FIG. 3 illustrates a component 100 according to a second embodiment of the invention. Such a component is differentiated from a component according to the first embodiment in that it further comprises a semiconductor layer 125 comprising gallium (Ga) in contact with the silicon carbide layer 120, each wire comprising a portion 131*b* of said semiconductor layer 125.

A component 100 according to this possibility thus comprises a semiconductor layer 125 of a first semiconductor material comprising gallium in contact with the silicon carbide layer 120 on its face which is opposite to the substrate 110. In this embodiment, the semiconductor layer 125 has a thickness between 1 and 5 nm. The semiconductor layer 125 has the first type of conductivity and comprises a concentration of majority carriers sufficient to ensure a good electrical contact with the silicon carbide layer 120.

Each wire body 131 comprises the portion 131*b* of the semiconductor layer 125 which is included between the silicon carbide layer 120 and the rest 131*a* of the corresponding wire body 131. The semiconductor layer 125 and the wire bodies 131*b* are made of the first semiconductor material.

The semiconductor layer 125 and the wire bodies 131*b* have the first type of conductivity. The concentration of majority carriers of the semiconductor layer 125 and of the wire bodies 131*b* is suitable for providing an ohmic contact with the substrate through the silicon carbide layer 120. Thus, the semiconductor layer 125 and the wire bodies 131*b* have preferentially a concentration of majority carriers higher than $10^{18}$ cm$^{-3}$.

In the particular application, the first material is gallium nitride. The semiconductor layer 125 and the wire bodies 131*b* have a type of conductivity for which the majority carriers are electrons. The semiconductor layer 125 and the wire bodies 131*b* have a concentration of majority carriers substantially higher than $10^{18}$ cm$^{-3}$.

A method for manufacturing a component 100 according to this second embodiment is differentiated from a method for manufacturing a component 100 according to this second embodiment in that the step of forming the semiconductor wire bodies 131 comprises the following sub-steps of:
  forming a semiconductor layer 125 comprising gallium in contact with the silicon carbide layer 120,
  forming the rest of the wire body 131*b* in contact with the semiconductor layer 125 such that the wire bodies 131 comprises the portions 131*b* of the semiconductor layer 125 comprised between each of the wire bodies 131 and the silicon carbide layer 120.

If, in the embodiments described above, the structures described are semiconductor wires having a shell configuration, that is an active zone covering the end of a longitudinal wire body as illustrated in FIG. 1, the invention is not limited to this single configuration and also relates to the structures having another type of configuration. Thus, the invention also covers the other types of semiconductor structures such as semiconductor wires having a wire configuration, that is having a junction on a plane perpendicular to the axis of the wire, or the structures of the pyramidal type.

In all the embodiments described above, the step of growing the structures is made by means of a mask by growing wires on free surface portions of the mask, the growth of the wires on the rest of the surface being inhibited by the presence of the mask. However, the structures, regardless of whether they are wires or not, can be obtained also by a step of growing of another type without departing from the scope of the invention.

Thus, for example the structures can be formed, without departing from the scope of the invention, by a method comprising a step of depositing a first material comprising gallium under deposition conditions suitable for forming self-organized structures at the surface of the silicon carbide layer. The method can also comprises the following steps of:
  forming a mask in contact with the silicon carbide layer, said mask covering at least one surface portion of the silicon carbide layer which is called a formation portion, and leaving free the rest of the silicon carbide layer
  selectively removing the rest of the silicon carbide layer which is free of mask, the at least one surface portion of the silicon carbide layer remaining protected by the mask,
  removing the mask so as to release the at least one portion,
  growing at least one structure in contact with the at least one formation portion.

According to this same possibility, and also without departing from the scope of the invention, the method can comprise the following steps of:
  forming a layer of the first material in contact with at least one part of the silicon carbide layer, at least one portion of said part, called a formation portion, being intended to form one part of the at least one semiconductor structure,
  forming a mask in contact with the layer of the first material, said mask leaving free the at least one surface portion of the layer of the material which is called a formation portion,
  growing the rest of the at least one wire in contact with the at least one formation portion.

The invention claimed is:

1. A method for manufacturing at least one semiconductor structure comprising:
  providing a substrate comprising at least one semiconductor silicon surface;
  forming an amorphous silicon carbide layer in contact with at least one part of the semiconductor silicon surface;
  forming the at least one semiconductor structure in contact with the amorphous silicon carbide layer, the at least one semiconductor structure comprising at least a first part in contact with the surface of the amorphous silicon carbide layer, the first part comprises gallium,
  wherein the at least one semiconductor structure comprises a semiconductor wire.

2. The manufacturing method according to claim 1, wherein a thickness of the amorphous silicon carbide layer is lower than 10 nm.

3. The manufacturing method according to claim 1, wherein a thickness of the amorphous silicon carbide layer is lower than 5 nm.

4. The manufacturing method according to claim 1, wherein the forming the amorphous silicon carbide layer comprises chemical deposition of silicon carbide on the semiconductor silicon surface or a plasma enhanced chemical vapor deposition.

5. The manufacturing method according to claim 1, wherein the first part is of gallium nitride.

6. The manufacturing method according to claim 1, wherein the forming the amorphous silicon carbide layer comprises:
  depositing a thick amorphous silicon carbide layer on at least one part of the semiconductor silicon surface;
  removing a part of the thickness of the thick amorphous silicon carbide layer to form the amorphous silicon carbide layer.

7. The manufacturing method according to claim 1, wherein the forming the at least one semiconductor structure comprises:

forming a mask in contact with the surface of the amorphous silicon carbide layer, the mask leaving free at least one surface portion of the amorphous silicon carbide layer as a formation portion;

growing the at least one semiconductor structure in contact with the formation portion.

8. The manufacturing method according to claim 1, wherein a contact part of the at least one semiconductor structure is formed of a first material comprising gallium, the forming the at least one semiconductor structure comprising forming a layer with the first material.

9. A semiconductor component comprising:

a substrate comprising at least one semiconductor silicon surface;

an amorphous silicon carbide layer in contact with at least one part of the semiconductor silicon surface;

at least one semiconductor structure in contact with the amorphous silicon carbide layer, the part of the at least one semiconductor structure in contact with the amorphous silicon carbide layer comprising gallium, wherein the at least one semiconductor structure comprises a semiconductor wire.

10. The semiconductor component according to claim 9, wherein the amorphous silicon carbide layer has a thickness lower than 10 nm.

11. The semiconductor component according to claim 9, wherein a layer of a first material comprising gallium is further provided, the at least one semiconductor structure comprising a part of the layer by which it is in contact with the silicon carbide layer.

12. The semiconductor component according to claim 9, wherein the at least one semiconductor structure comprises a body of gallium nitride by which it is in contact with the amorphous silicon carbide layer.

* * * * *